United States Patent [19]

Boltz, Jr.

[11] 3,878,470

[45] Apr. 15, 1975

[54] FM DEMODULATOR

[75] Inventor: Charles D. Boltz, Jr., Greenwood, Ind.

[73] Assignee: RCA Corporation, New York, N.Y.

[22] Filed: July 16, 1973

[21] Appl. No.: 379,469

[30] Foreign Application Priority Data

Aug. 18, 1973 United Kingdom .............. 38708/73

[52] U.S. Cl. ................ 329/126; 328/110; 329/106; 329/112; 329/145

[51] Int. Cl. .............................................. H03d 3/04

[58] Field of Search ............ 329/106, 107, 50, 126, 329/110, 112, 129, 130, 145, 146; 328/110, 112, 133

[56] References Cited

UNITED STATES PATENTS

| | | | |
|---|---|---|---|
| 2,830,179 | 4/1958 | Stenning | 328/110 X |
| 3,233,181 | 2/1966 | Calfee | 329/128 |
| 3,327,226 | 6/1967 | Nourney | 328/110 X |
| 3,392,337 | 7/1968 | Neuburger | 329/145 |
| 3,514,705 | 5/1970 | Feigleson | 328/133 |
| 3,699,461 | 10/1972 | Huntsinger | 329/50 X |

OTHER PUBLICATIONS

Smith, "Voltage pulse Width Select Circuit"- Vol. 7, No. 1, June 1964 - IBM Tech. Disclosure Bulletin, p. 27.

*Primary Examiner*—Alfred L. Brody
*Attorney, Agent, or Firm*—Eugene M. Whitacre; Mason DeCamillis

[57] ABSTRACT

A source of frequency modulated signals is coupled to a coincidence detector by a first and a second signal path. The first and second signal paths have unequal signal delay characteristics so that the coincidence detector provides an output signal comprised of a series of substantially constant width pulses wherein pulse width is determined by the difference in signal delay between the first and second signal paths. A low pass filter is coupled to the coincidence detector for recovering the signal modulation represented by the series of substantially constant width pulses.

7 Claims, 2 Drawing Figures

FM DEMODULATOR

Figure 1:
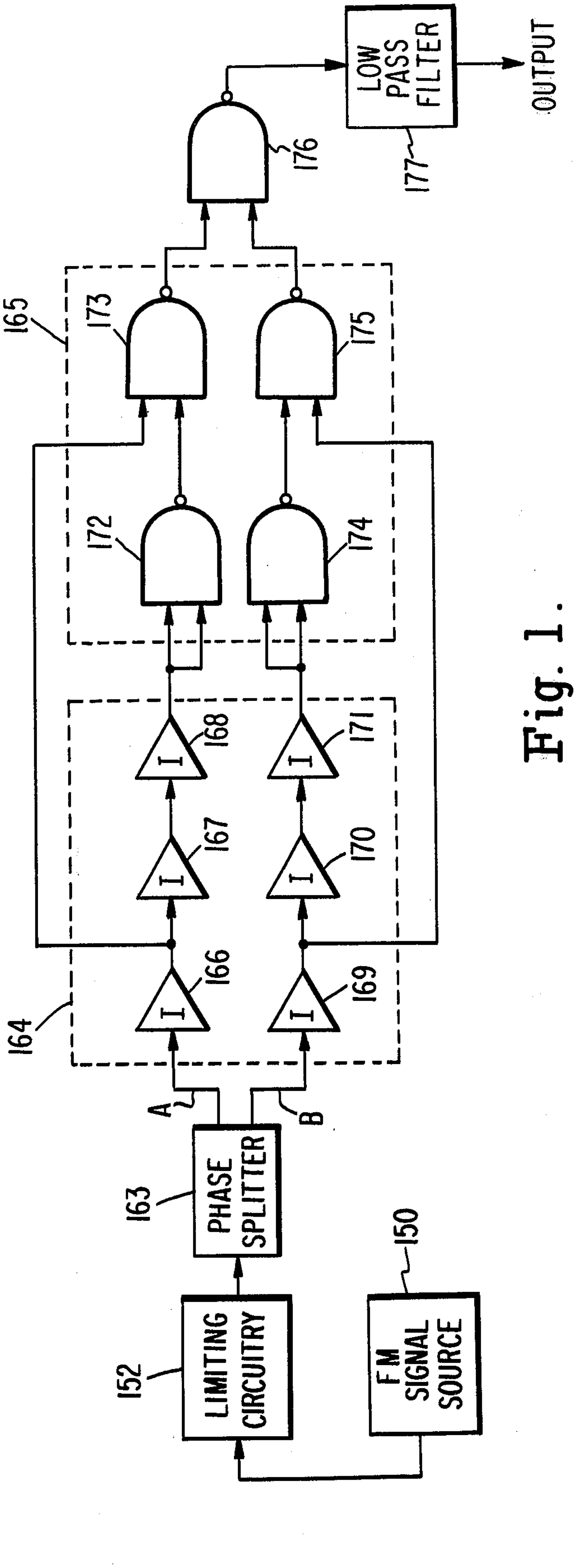

This invention relates to frequency modulation (FM) detectors of the pulse counter type.

FM demodulation by "pulse count" techniques has seen increasing use in recent years, particularly in wideband FM systems. FM demodulation by the pulse count method has also been used to overcome the disadvantages of earlier prior art tuned circuit type of FM demodulators which required transformers or tuned circuits which may be subject to frequency drift.

In a pulse counter type of FM demodulator, the frequency modulated signals typically are amplified and limited to produce so-called "square waves" which have zero axis crossings spaced in the same manner as the FM waves. The "square waves" are then converted into pulses of constant amplitude and width (time duration) independent of the frequency of the applied FM signal. Generally a constant width pulse is produced at each zero crossing of the modulated input signal. The resulting signal, in the form of a series of constant width pulses, is then integrated (or filtered) to reproduce the modulating signal information.

Pulse counter demodulators of the type described have been constructed using various forms of frequency doubling in order to improve the quality of the recovered signal information after integration and to provide an increased separation between the recovered pulse signal and the frequency of the modulating signal. This latter feature is of particular importance in wideband FM demodulators used in video systems.

In one form of pulse counter demodulator, two oppositely phased, limited square waves derived from the FM wave are coupled to individual one-shot (astable) multivibrators. Pulses produced by each one-shot multivibrator at zero crossover points of the FM signal are then summed in an adder to provide a series of pulses at twice the repetition rate of the frequency deviated carrier wave. A low pass filter integrates this series of pulses to recover the modulating signal.

This described form of pulse counter, however, exhibits operating disadvantages. It is difficult to achieve identical one-shot multivibrators. This problem of symmetry of one-shot multivibrators increases as the operating temperature range varies, producing temperature tracking problems. If the one-shot multivibrators are not exactly alike, the pulse that is produced at each zero crossing will differ, i.e., contain different amounts of energy or be of a different width.

This non-perfect tracking, due to component as well as temperature variation, produces unwanted harmonics which will appear in the demodulated signals. Similarly, tracking variations in the adder circuit produces unwanted signals in the demodulated output if the adder does not keep both one-shot multivibrator pulse outputs balanced. Pulse counter demodulators have been constructed using a single one-shot multivibrator triggered at each crossover to avoid the difficulties of identical circuit construction and temperature tracking. However, the high frequency operation for which the pulse counter method of FM demodulation is most desirable becomes marginal due to recovery time difficulties encountered in using a single one-shot multivibrator, i.e., the delay time of the multivibrator approaches the period of the high frequency signals as the operating frequency is increased.

In accordance with the present invention apparatus for demodulating a frequency modulated signal is provided wherein a source of frequency modulated signals is coupled to a coincidence detector by a first and a second signal path. The first and second signal paths have unequal signal delay characteristics so that the coincidence detector provides an output signal comprised of a series of substantially constant width pulses wherein pulse width is determined by the difference in signal delay between the first and second signal paths. A low pass filter is coupled to the coincidence detector for recovering the signal modulation represented by the series of substantially constant width pulses.

Figure 2:
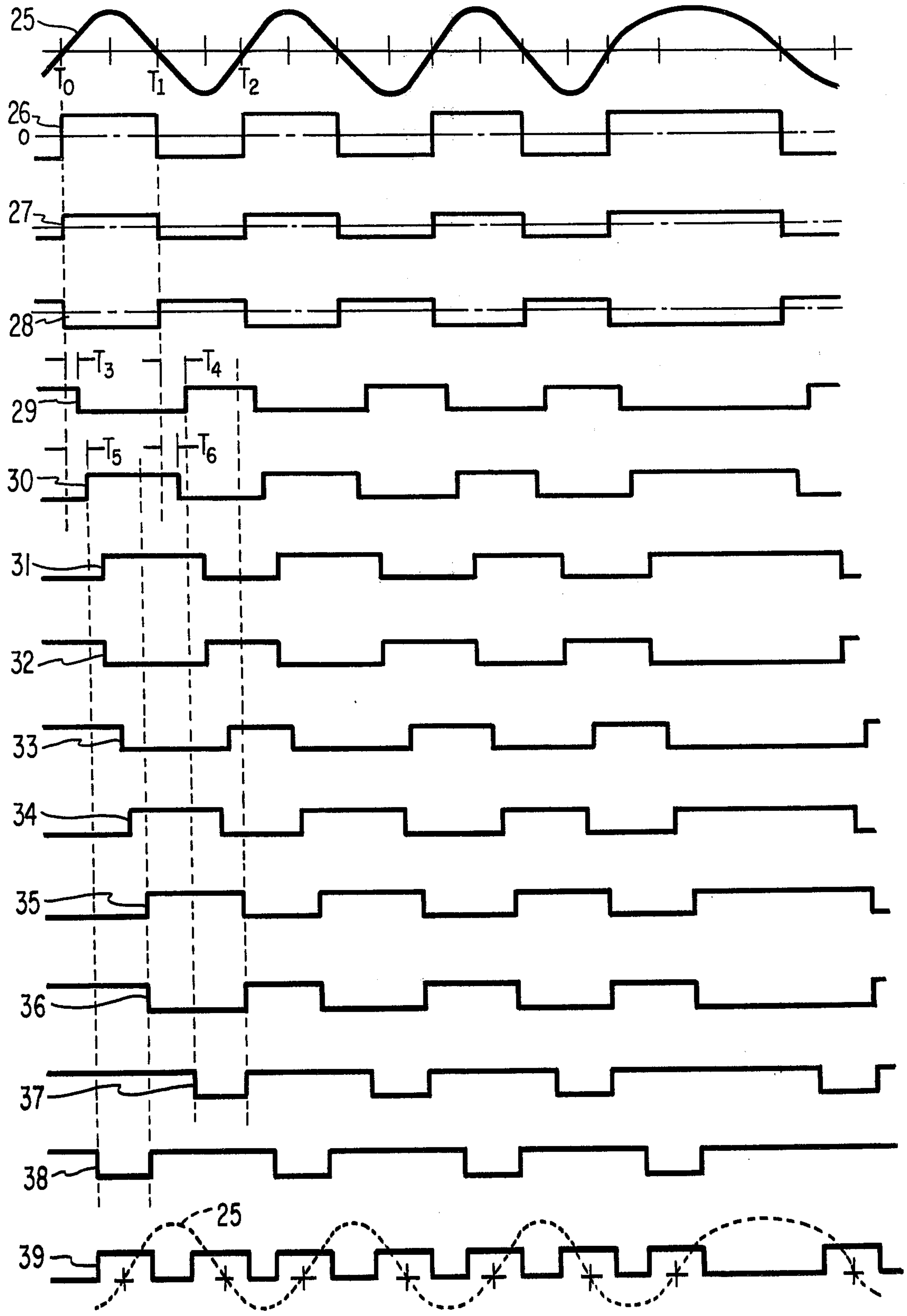

Referring to the accompanying drawings:

FIG. 1 is a block diagram of a pulse counter type of frequency modulation detector constructed in accordance with the invention; and FIG. 2 is a series of waveform diagrams representative of the signal processing of the FM demodulator shown in FIG. 1.

In FIG. 1, an FM signal is coupled to a limiter 152 and then to a phase splitter 163 which serve to provide two "squared" signals of opposite phase with zero axis crossings corresponding to the zero crossings of the modulated FM signal. The signals from the phase splitter are processed in substantially identical signal channels as follows. A first of the outputs of the phase splitter 163 (signal A) is coupled through a first signal path comprising inverters 166,167,168 and nand gate 172. The input terminals of nand gate 172 are arranged so that it performs the same function as inverters 166,167,168.

Inverters 166,167 and 168 are illustrated as included in a first integrated circuit indicated by the dashed outline 164 while nand gate 172 is in a second integrated circuit 165. Nand gate 172 may, in practice, be replaced by an additional inverter on the integrated chip 164. The output of this first path 166,167,168,172 is coupled to one input of a coincidence detector 173. The output of inverter 166 is also coupled via a direct connection to a second input of coincidence detector 173, the inverter 166 and the direct connection providing a second signal path for the signal A. Coincidence detector 173 will provide an output whenever both of its inputs are of the same status, i.e., coincidence detector 173 will produce a "down" output when both of its inputs are "up."

A second signal channel which processes signal B from phase splitter 163 also is provided. In the same manner as was described in connection with the first signal channel, signal B is direct coupled to one input of a coincidence detector 175 via an inverter 169 and is further coupled to a second input of detector 175 through a circuit comprising inverters 170,171 and nand gate 174. The output signals from coincidence detectors 173 and 175 are summed in a summer 176. The combined waveform from the output of summer 176 is integrated in a low pass filter 177 to provide an output signal which corresponds to the modulation signal information contained in the FM input signal applied to the pulse counter demodulator as will be explained below.

FIG. 2 shows waveforms useful in describing the operation of the pulse counter demodulator shown in FIG. 1. Waveform 25 is representative of a frequency modulated wave having zero axis crossings which are displaced from those of the carrier wave according to the modulation content imposed on the fundamental carrier frequency. Waveform 26 represents the output waveform of limiter 152 and is of a squared waveshape having zero axis crossings corresponding to the zero axis crossings of the input signal 25 which is coupled to the input of limiter 152.

The signal represented by waveform 26 is coupled to phase splitter 163 which provides two output signals, one (waveform 27) in phase with the input signal and a second signal (waveform 28) 180° out-of-phase with the input signal 26. The signal represented by waveform 27 is coupled into inverting stage 166. Inverter stage 166 exhibits a signal propagation delay which delays the positive going excursions by a first interval (e.g., approximately 8 nanoseconds) and the negative going excursions by a second interval (e.g., approximately 12 nanoseconds). These delays are represented by the times T3 and T4 shown in waveform 29 which is representative of the output of inverter 166. In a similar manner, inverter 169 will delay waveform 28, producing waveform 30 which has a negative-going portion delayed, for example, by 12 nanoseconds and a positive-going portion delayed, for example, by 8 nanoseconds. These delays are shown at times T5 and T6.

Where each of the inverters is of substantially identical structure, similar delays occur as the signals pass through inverters 167,168, nand gate 172, inverters 170, 171, and nand gate 174. The corresponding delays are shown accumulative in waveforms 31,33,35,32,34, and 36 respectively.

The output of inverter 166, represented by waveform 29, and the output of nand gate 172, represented by delayed waveform 35, are coupled to coincidence detector 173. The output of coincidence detector 173 is represented by waveform 37 which is a series of pulses of substantially constant width. The difference in signal delay between the signal paths coupled to coincidence detector 173 will determine the duration that coincidence detector 173 provides an output. The pulse output of coincidence detector 173 therefore is of substantially constant width and would suffice as a signal suitable for demodulation when connected directly to a low pass filter.

However as previously mentioned, it is desirable to increase the separation between the recovered signal and the frequency of the modulating signal in a wideband FM system such as used in video recording and demodulation. Therefore, the output of inverter 169, represented by waveform 30, and the output of nand gate 174, represented by delayed waveform 36, are coupled to coincidence detector 175. The output of coincidence detector 175 is represented by waveform 38 which is a series of pulses substantially identical in width to the output of coincidence detector 173, but displaced in time by virtue of the 180° phase difference in signals represented by phase splitter waveforms 27 and 28. Waveform 39 shows the output of the summing circuit 176 which has as its inputs waveforms 37 and 38. The resulting waveform 39 is a series of substantially constant width and constant amplitude pulses at twice the input frequency, i.e., a pulse at each zero crossing of input waveform 25.

As was shown above, a typical propagation delay for each of the inverting stages 166 through 172 is 8 nanoseconds for a positive transition and 12 nanoseconds for a negative transition. If a signal is coupled through one stage or an odd number of stages, it can be seen that this will produce some distortion to the signals (waveforms 29 and 30). However, two stages or an even number of stages will restore the proper time relationship between leading and trailing edges of the waveform (waveforms 35 and 36). In one application of this invention relating to the recording of television (video) signals, it is desirable to use a carrier frequency of approximately 6.5 MHz. In that case, three stages of delay are used with an added logic stage. This provides a typical delay of 31 nanoseconds and a maximum delay of 59 nanoseconds. These delays will provide suitable pulse widths at the output of summer circuit 176 (waveforms 39).

As can be seen from FIG. 1 and the associated waveforms of FIG. 2, both signal phases are handled substantially identical to provide the desired equal pulse widths and proper time sequence. An even number of logic stages is provided to restore waveform distortion due to the unequal delay for positive and negative transitions. Since the delays are accomplished on the same integrated circuit chips 164,165, substantially equal temperature and device tracking results. The pulse width is a function of the signal propagation delay of the particular device used and can be made to fit within system design limits. Since both signal phases are handled substantially identical, the conventional pulse counter problems previously described resulting from separate one-shot multivibrator and temperature drift are overcome.

The illustrated embodiment shown in FIG. 1 may be constructed using a Signetics TTL type 7404 Hex inverter for integrated circuit 164 and a Signetics TTL type 7400 quad nand gate for integrated circuit 165. The system limits were chosen to operate around a carrier frequency of approximately 6 MHz with a deviation of 1 MHz. In actual use, the demodulator may be employed at various higher or lower frequencies. The arrangement utilizing the named devices is expected to function well at least up to approximately 9 MHz of carrier frequency.

What is claimed is:

1. Apparatus for demodulating a frequency modulated signal comprising:

a source of frequency modulated signals having first and second signal output terminals providing first and second signals of opposite phase, a first signal processing channel comprising:

a first coincidence detector;

a first signal path coupled from said first signal terminal to said first coincidence detector;

a second signal path coupled from said first signal terminal to said first coincidence detector;

said first and second signal paths exhibiting unequal signal time delay characteristics whereby said first coincidence detector provides a first output signal which is a series of substantially constant width pulses having a width determined by the difference in signal delay between said first and second signal paths; and a second signal processing channel comprising:

a second coincidence detector;

a third signal path coupled from said second signal terminal to said second coincidence detector;

a fourth signal path coupled from said second signal terminal to said second coincidence detector;

said third and fourth signal paths exhibiting unequal signal time delay characteristics whereby said second coincidence detector provides a second output signal which is a series of substantially constant width pulses having a width determined by the difference in signal delay between said third and fourth signal paths, and occurring in timed relation with respect to pulses of said first output signal according to the relative phases of said first and second signals provided by said source of signals;

summing means coupled to said first and second coincidence detectors and responsive to their respective output signals to provide a third output signal consisting of a series of substantially constant width pulses, the repetition rate of which is a multiple of said frequency modulated signal repetition rate; and low pass filter means coupled to said summing means and responsive to said third output for recovering the signal modulation represented by the summation of said first and second series of substantially constant width pulses.

2. Apparatus in accordance with claim 1 for demodulating a frequency modulated signal wherein:

said source of frequency modulated signals comprises a limiter coupled to a phase splitter to provide squared signals of opposite phase in which respective positive and negative going transitions correspond to the zero crossings of the modulated signal.

3. Apparatus for demodulating a frequency modulated signal comprising:

a source of frequency modulated signals;

a limiter circuit coupled to said source to provide squared signals of substantially constant amplitude and width corresponding in time occurrence to zero axis crossings of said frequency modulated signal;

a phase splitter coupled to said limiter output to provide first and second signals of opposite phase;

a first signal channel having a first coincidence detector with one input direct coupled through a first signal path to said first phase splitter signal; said first coincidence detector having a second input coupled through a second signal path having first signal delay means;

a second signal channel having a second coincidence detector with one input direct coupled through a third signal path to said second phase splitter signal, said second coincidence detector having a second input coupled through a fourth signal path having second signal delay means;

said first and second signal delay means comprising first, second, and third devices for providing a predetermined signal delay so that the output of said first and second coincidence detectors comprises a series of pulses of substantially constant width and substantially constant amplitude, wherein said width is determined by the signal delay of said devices in said second and fourth signal paths as compared to the respective first and third direct coupled signal paths;

summing means coupled to the output of said first and second coincidence detectors and responsive to the respective outputs to provide a third output consisting of a series of substantially constant amplitude and constant width pulses having a repetition rate which is a multiple of the repetition rate of said frequency modulated signals;

and low pass filter means coupled to said third output for recovering the signal modulation represented by the summation of said first and second series of output pulses.

4. Apparatus in accordance with claim 1 for demodulating a frequency modulated signal wherein:

said first and third signal paths comprise a direct coupling to said first and second coincidence detectors; and said second and fourth signal paths include signal delay means such that the width of individual ones of said output pulses from said coincidence detectors is substantially equal to the delay characteristics of said delay means coupled to said second signal path.

5. Apparatus in accordance with claim 1 for demodulating a frequency modulated signal wherein:

said signal delay means comprises at least one signal translating device exhibiting a predetermined delay in response to positive-going and negative-going transitions of said squared signal wave, said predetermined delay determining the width of said pulses of said output signal.

6. Apparatus in accordance with claim 1 wherein:

said delay means comprises a plurality of signal amplifying stages, each said stage exhibiting a delay whereby the width of said output pulses is determined by the sum of the signal delays of said amplifying stage.

7. Apparatus in accordance with claim 1 wherein:

said amplifying stages are similarly constructed and are operating in a common thermal environment.

* * * * *

UNITED STATES PATENT OFFICE

CERTIFICATE OF CORRECTION

PATENT NO. : 3,878,470

DATED : April 15, 1975

INVENTOR(S) : Charles D. Boltz, Jr.

It is certified that error appears in the above-identified patent and that said Letters Patent are hereby corrected as shown below:

On title sheet under Foreign Application Priority Data that portion reading "Aug. 18, 1973 United Kingdom 38708/73" should read -- Aug. 18, 1972 United Kingdon 38708/72 --.
On title sheet under Other Publications that portion reading "Smith, "Voltage pulse Width Select Circuit" Vol. 7, No. 1, June 1964 - IBM Tech. Disclosure Bulletin, p. 27" should read -- Voltage Pulse Width Select Circuit, Vol. 7, No. 1, June 1964 - IBM Tech. Disclosure Bulletin, p. 27, 328-112 --.
Column 4, line 23 after "signal" insert -- from source 150 --

Signed and Sealed this

*twenty-fifth* Day of *November 1975*

[SEAL]

*Attest:*

RUTH C. MASON
*Attesting Officer*

C. MARSHALL DANN
*Commissioner of Patents and Trademarks*